United States Patent [19]

Lovely

[11] 4,363,033

[45] Dec. 7, 1982

[54] VIDEO SWITCH CIRCUIT

[75] Inventor: John D. Lovely, Batavia, N.Y.

[73] Assignee: GTE Products Corporation, Seneca Falls, N.Y.

[21] Appl. No.: 155,702

[22] Filed: Jun. 2, 1980

[51] Int. Cl.³ .................. H04N 5/22; H03K 17/74
[52] U.S. Cl. .................................... 358/181; 358/183; 307/243; 307/259
[58] Field of Search ................... 358/181, 183, 22; 328/137, 104, 97, 154, 101; 455/133–135; 307/243, 256, 257, 259, 244

[56] References Cited

U.S. PATENT DOCUMENTS 3,006,993 10/1961 Barndt .................................. 358/183
3,207,842 9/1965 Flagle .................................. 358/183
4,282,447 8/1981 Summers et al. .................... 307/243

Primary Examiner—John C. Martin
Attorney, Agent, or Firm—Thomas A. Briody; William J. Streeter; Edward W. Goodman

[57] ABSTRACT

A circuit for selecting one of a number of video signals to be processed by a television receiver. The circuit comprises diode means having inputs suitable for coupling to alternate sources of video signals. A bias source applies a bias voltage to the diode means and control means applies various control voltages to the diode means. The relationship of the control voltages to the bias voltage determines which of the alternate sources of video signals are coupled to the output of the diode means.

16 Claims, 2 Drawing Figures

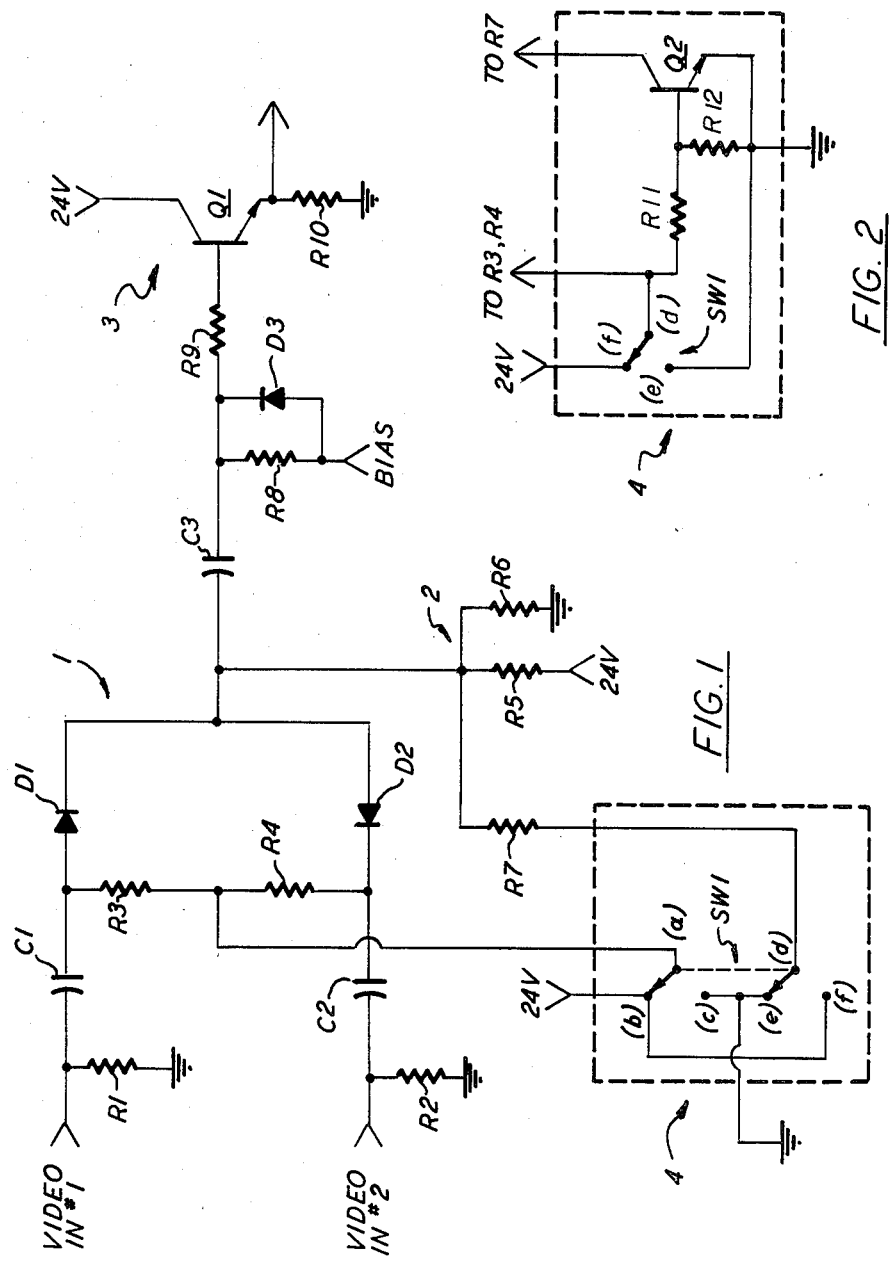

VIDEO SWITCH CIRCUIT

TECHNICAL FIELD

This invention relates to electronic switching circuits and more particularly to a circuit for selecting between alternative sources of video signals to be processed by a television receiver.

BACKGROUND ART

With the emergence of the television receiver as a vehicle for receiving, demodulating, and reproducing more than merely the broadcaster's signals, it has become necessary to provide circuitry for interfacing the receiver with peripheral equipments. Examples of such equipments are video tape and video disc players and home video games. Although these equipments can be made to provide a modulated RF signal that can be coupled to the receiver through its antenna terminals, enhanced picture quality can be achieved by utilizing video signals coupled into the receiver's video processing circuitry. Clearly when more than one video source is available, means for selecting the desired source must be provided. This invention is directed to a simple and cost-effective video switch for selecting one of a plurality of available sources of video signals.

DISCLOSURE OF THE INVENTION

The invention is a video switch comprising diode means having inputs that may be coupled to at least two sources of video signals. A bias source coupled to the output of the diode means applies a bias voltage to the diode means. A control circuit is coupled to the input of the diode means and selectively applies control voltages of various amplitudes to those inputs, thereby determining, in conjunction with the bias source, which of said video signals is coupled to the output of the diode means.

The subject video switch represents a relatively simple and cost-effective interface between the video processing portion of a television receiver and alternate source of video signals, such as video discs and tape recorders. Applying these peripheral sources of video signals directly to the receivers video circuit, rather than to the receiver antenna terminals, which would entail a modulation and demodulation process, has been found to result in improved picture quality.

BRIEF DESCRIPTION OF THE DRAWING

The sole drawing is a schematic diagram of the subject video switch.

BEST MODE FOR CARRYING OUT THE INVENTION

For a better understanding of the present invention, together with other and further objects, advantages and capabilities thereof, reference is made to the following disclosure and appended claims in connection with the above-described drawing.

Referring now to the drawing, a first source of video signals (not shown) is coupled to Video Input #1. That input is coupled through a resistor R1 to ground and through a capacitor C1 to a first input of diode means 1 at the anode of D1. Similarly, a second source of video signals (also not shown) is coupled through as resistor R2 to ground and through a capacitor C2 to a second input of diode means 1 at the cathode of diode D2. The cathode of D1 and the anode of D2 form the output of the diode means. The output of the diode means is coupled to a bias source 2 formed by the series-connected resistors R5 and R6. R5 and R6 are coupled between a 24-volt supply and ground and are chosen so that a bias voltage equal to approximately one-half the difference of those voltages, twelve volts, appears at this junction and is coupled to the output of the diode means.

The output of the diode means is also coupled through a capacitor C3 to an output buffer 3. The buffer may be optional or modified depending on the specific circuitry with which the video switch is used. In the shown embodiment, the buffer includes an NPN transistor Q1 having a collector coupled to the 24-volt supply and an emitter coupled through resistor R10 to ground. The base of Q1 is coupled through resistor R9 to C3 and to one end of a parallel-connected resistor R8 and diode D3. The other end of R8 and D3 is coupled to a bias voltage appropriate to the characteristics of the video signals encountered and the requirements of Q1.

Control means 4, including a ganged DPDT switch, SW1, determines which of the two video signals appears at the output of the video switch. Although for the purposes of convenience the switch is illustrated in a conventional mechanical configuration, that illustration is deemed generic and substitution for it by conventional electronic or hybrid, configurations, as described below, in no way departs from this invention. SW1 has a first pole (a) coupled through resistor R3 to the anode of D1 and through a resistor R4 to the cathode of D2. A first terminal (b) associated with pole (a) is coupled to a first control voltage, that is, the 24-volt supply. Similarly a second terminal (c) is coupled to a second control voltage, ground. SW1 also includes a second pole (d) coupled through resistor R7 to the output of the diode means. Third and fourth terminals (e) and (f), associated with pole (d), are coupled to ground and the 24-volt supply, respectively.

Operation is as follows. With SW1 in a first position as shown in the drawing (pole (a) to terminal (b), pole (d) to terminal (e)), 24 volts will appear at the junction of R3 and R4. Because the bias supply maintains a voltage of approximately 12 volts at the output of the diode means, D1 will be forward biased (conducting) and D2 will be reverse biased (non-conducting). As a result the signal from the first video source will be coupled to the output of the diode means and the signal from the second video source isolated from it. The appropriate 12-volt reverse bias voltage across D2 tends to reduce its junction capacitance and therefore minimizes the coupling of signals from the second video to the output of the diode means. Conversely with SW1 in a second or alternate position (pole (a) coupled to terminal (c) and ground; pole (d) coupled to terminal (f) and the 24-volt supply), D1 will be reverse biased (non-conducting) and D2 will be forward biased (conducting). As a result the signal from the second video source will be coupled to the output of the diode means and the signal from the second video source isolated from it.

To those with ordinary skill in the art, it is apparent that the upper section of SW1 (that is, pole (a) and terminals (b) and (c)) is by itself sufficient to switch D1 and D2 and therefore video sources. However, when done in this manner it can be shown that the DC voltage at the output of the diode means will be approximately two diode drops (about 1.4 volts) higher when the control switch is in the first position than when it is in the second position. By arranging the second section (pole (d) and terminals (e) and (f)) as described above, the DC voltage at the output of the diode means remains substantially independent of the video source chosen. While not necessarily essential in other types of equipments, it is generally desirable to maintain a constant DC input to the DC-coupled video channel of a television receiver. Variations at the DC will be manifest as variations in the overall brightness of the television image.

Various modifications can be made without departing from the scope of the subject invention. For example, the second section of SW1, comprising pole (d) and terminals (e) and (f), can be replaced by the circuitry shown in FIG. 2. The replacement circuitry includes an NPN transistor Q2 having a collector connected to the end of R7 that would otherwise be connected to pole (d) and an emitter connected to ground. The base of Q2 is coupled through resistor R11 to pole (d) and through resistor R12 to ground. Because Q2 will be effectively saturated when SW1 is in the first position and effectively cutoff when SW1 is in the second position, operation will be substantially equivalent to that obtained with the inclusion of the second section of the DPDT switch.

Furthermore, although the bias voltage applied to buffer 3 may, in some equipments, be a simple DC supply, the DC-coupled video channel of high-quality television receivers is sufficiently sensitive to the DC component of the demodulated video signal so that a clamping circuit may be required to restore the DC component of the video signal applied to the base of Q1. DC restoration or clamping circuits are well known to circuit designers skilled in the art and the particular circuit decided upon can be applied to Q1 through R8 and D3. Because the DC voltage at the output of the diode means is maintained substantially independent of the video signal source chosen, the switching transient often associated with the DC restoration circuitry will be minimized.

Finally, although the subject invention has for the purposes of explication been described with particular reference to the switching and selection of television video signals, it is clear that the circuit described herein has widespread application in other types of electronic equipment.

Accordingly, while there has been shown and described what are at present considered the preferred embodiments of the invention, it wil be obvious to those skilled in the art that various changes and modifications may be made therein without departing from the scope of the invention as defined by the appended claims.

INDUSTRIAL APPLICABILITY

The subject video switch is useful in equipments to which are selectively applied signals from a plurality of sources.

What is claimed is:

1. A video switch comprising diode means having a first and a second input coupled respectively to a first and a second source of signals, and an output, said diode means including a first diode having an anode coupled to said first input and a second diode having a cathode coupled to said second input, the cathode of said first diode and the anode of said second diode being coupled in common to said output; a bias source coupled to the output of said diode means for applying a bias voltage to the output thereof; and control means coupled to the first and second inputs of said diode means for selectively applying respective first and second control signals thereto for determining, in conjunction with said bias source, which of said signal sources is coupled to the output of said diode means.

2. A video switch as defined in claim 1 and wherein said first control voltage has a value greater than the bias voltage and said second control voltage has a value less than the bias voltage.

3. A video switch as defined in claim 1 or 2 and wherein said control means comprises a control switch having
a first pole;
first and second terminals associated with said first pole;
a second pole; and
third and fourth terminals associated with said second pole.

4. A video switch as defined in claim 3 and wherein the first pole is coupled to the inputs of the diode means, the second pole is coupled to the output of the diode means and to the bias source, the first and fourth terminals are coupled to the first control voltage, and the second and third terminals are coupled to the second control voltage.

5. A video switch as defined in claim 4 wherein said control switch is characterized by a first position according to which the first pole is coupled to the first control voltage and the second pole is coupled to the second control voltage so that the first diode is rendered conductive and the second diode is rendered non-conductive whereby the first source of signals is enabled to be coupled to the output of the diode means.

6. A video switch as defined in claim 5 wherein said control switch is characterized by a second position according to which the first pole is coupled to the second control voltage and the second pole is coupled to the first control voltage so that the first diode is rendered non-conductive and the second diode is rendered conductive whereby the second source of signals is enabled to be coupled to the output of the diode means.

7. A video switch as defined in claim 4 wherein said bias voltage is approximately equal to one-half the difference between the first control voltage and the second control voltage.

8. A video switch as defined in claim 4 wherein said first and second diodes are coupled through respective capacitances to the first and second sources of signals.

9. A video switch as defined in either claim 1 or claim 2 and wherein said control means comprises:
a control switch having a pole coupled to the inputs of the diode means, associated first and second terminals, respectively coupled to the first and second control voltages; and
a semiconductor device having an input electrode coupled to the pole, and output electrode coupled to the output of the diode means and a common electrode coupled to a reference potential.

10. A video switch as defined in claim 9 wherein the control switch is characterized by a first position according to which the pole is connected to the first terminal and a second position according to which the pole is connected to the second terminal whereby the semiconductor device is rendered conductive when the control switch is in the first position and non-conductive when the pole is in the second position.

11. A video switch comprising:
a first diode having an anode to be coupled to a first source of video signals;
a second diode having cathode to be coupled to a second source of video signals;

a bias source coupled to the cathode of the first diode and the anode of the second diode for applying a bias voltage thereat;

a control switch having at least a first pole and first and second terminals associated therewith, the first pole being coupled to both the anode of the first diode and the cathode of the second diode, the first terminal being connected to a first control voltage and the second terminal being connected to a second control voltage.

12. A video switch as defined in claim 11 and wherein the control switch has a second pole and third and fourth terminals associated therewith, the second pole being coupled to the bias source, third terminal being connected the second control voltage, and the fourth terminal being connected to the first control voltage.

13. A video switch as defined in claim 11 further comprising a semiconductor device having: an input electrode coupled to the first pole, an output electrode coupled to the bias source; and a common electrode coupled to a reference potential.

14. A video switch as defined in either claim 12 or 13 wherein the control switch is characterized by a first position according to which the first control voltage is coupled to the anode of the first diode and the cathode of the second diode and by a second position according to which the second control voltage is coupled to the anode of the first diode and the cathode of the second diode.

15. A video switch as defined in claim 14 wherein the value of the bias voltage is approximately equal to one-half the difference between the first and second control voltages.

16. A video switch as defined in claim 14 wherein the semiconductor device is rendered conductive when the control switch is in the first position and non-conductive when the control switch is in the second position.

* * * * *